United States Patent
Bhatia et al.

(10) Patent No.: US 11,693,794 B2
(45) Date of Patent: Jul. 4, 2023

(54) TUNABLE AND SCALABLE COMMAND/ADDRESS PROTOCOL FOR NON-VOLATILE MEMORY

(71) Applicant: SANDISK TECHNOLOGIES LLC, Addison, TX (US)

(72) Inventors: Sneha Bhatia, Karnataka (IN); Vinayak Ghatawade, Karnataka (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 46 days.

(21) Appl. No.: 17/008,553

(22) Filed: Aug. 31, 2020

(65) Prior Publication Data
US 2022/0066958 A1     Mar. 3, 2022

(51) Int. Cl.
G06F 13/16     (2006.01)
G11C 16/04     (2006.01)
G11C 16/10     (2006.01)
G11C 16/32     (2006.01)
G11C 7/10      (2006.01)

(52) U.S. Cl.
CPC ...... *G06F 13/1668* (2013.01); *G11C 16/0483* (2013.01); *G11C 16/10* (2013.01); *G11C 16/32* (2013.01)

(58) Field of Classification Search
CPC .................................................. G06F 13/1668
USPC ................................................................ 710/5
See application file for complete search history.

(56) References Cited

U.S. PATENT DOCUMENTS

| | | | |
|---|---|---|---|
| 7,296,124 B1 * | 11/2007 | Falik | G06F 13/1647 711/219 |
| 7,949,817 B1 * | 5/2011 | Sakarda | G06F 1/324 713/320 |
| 8,953,396 B2 | 2/2015 | Abedifard | |
| 9,633,713 B2 | 4/2017 | Smith et al. | |
| 2007/0268775 A1 * | 11/2007 | Han | G11C 8/18 365/185.17 |
| 2009/0319748 A1 * | 12/2009 | Nakamura | G06F 12/0623 711/170 |
| 2015/0089112 A1 * | 3/2015 | Lo | G06F 13/4018 710/307 |
| 2015/0255166 A1 * | 9/2015 | Tseng | G11C 16/3459 365/185.17 |
| 2015/0310916 A1 * | 10/2015 | Leem | G11C 7/109 711/105 |
| 2019/0130978 A1 | 5/2019 | Linnen et al. | |
| 2019/0237117 A1 | 8/2019 | Polney | |
| 2019/0384352 A1 | 12/2019 | Carlough et al. | |

* cited by examiner

*Primary Examiner* — Chun Kuan Lee
(74) *Attorney, Agent, or Firm* — Morgan, Lewis & Bockius LLP

(57) ABSTRACT

A data storage system includes a storage medium including a plurality of memory cells; a storage controller in communication with the storage medium; and an electrical interface between the storage medium and the storage controller. The electrical interface includes an N-bit data bus; a data strobe; a command latch enable signal; and an address latch enable signal; wherein, while the command latch signal or the address latch enable signal is asserted, the storage medium is configured to: (i) receive command or address data via a subset of lines of the data bus; and (ii) latch the command or address data using the data strobe.

20 Claims, 14 Drawing Sheets

| Decoder speed target 10ns ||||  |
|---|---|---|---|
| TM Speed | Time Period (ns) | No. of IO (Bits) | No. of Clock Cycles | Clock Time@ Dec |
| 533 | 3.752 | 2 | 4 | 15.00 |
| 800 | 2.500 | 2 | 4 | 10.00 |
| 1000 | 2.000 | 2 | 4 | 8.00 |
| 1000 | 2.000 | 1 | 8 | 16.00 |
| 1200 | 1.667 | 1 | 8 | 13.33 |
| 1333 | 1.500 | 1 | 8 | 12.00 |
| 1600 | 1.250 | 1 | 8 | 10.00 |
| 2000 | 1.000 | 1 | 8 | 8.00 |

| Decoder speed target 5ns ||||  |
|---|---|---|---|---|
| TM Speed | Time Period (ns) | No. of IO (Bits) | No. of Clock Cycles | Clock Time@ Dec |
| 533 | 3.752 | 4 | 2 | 7.50 |
| 800 | 2.500 | 4 | 2 | 5.00 |
| 1000 | 2.000 | 4 | 2 | 4.00 |
| 1000 | 2.000 | 2 | 4 | 8.00 |
| 1200 | 1.667 | 2 | 4 | 6.67 |
| 1333 | 1.500 | 2 | 4 | 6.00 |
| 1600 | 1.250 | 2 | 4 | 5.00 |
| 2000 | 1.000 | 2 | 4 | 4.00 |

| Decoder speed target 1ns ||||  |
|---|---|---|---|---|
| TM Speed | Time Period (ns) | No. of IO (Bits) | No. of Clock Cycles | Clock Time@ Dec |
| 533 | 3.752 | 8 | 1 | 3.75 |
| 800 | 2.500 | 8 | 1 | 2.50 |
| 1000 | 2.000 | 8 | 1 | 2.00 |
| 1200 | 1.667 | 8 | 1 | 1.67 |
| 1333 | 1.500 | 8 | 1 | 1.50 |
| 1600 | 1.250 | 8 | 1 | 1.25 |
| 2000 | 1.000 | 8 | 1 | 1.00 |

Figure 6

TUNABLE AND SCALABLE COMMAND/ADDRESS PROTOCOL FOR NON-VOLATILE MEMORY

TECHNICAL FIELD

The present disclosure relates to data storage systems, and in particular, to an interface between a storage controller and a storage medium of a data storage system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

The interface between a storage controller and corresponding storage mediums in non-volatile memory often acts as a bottleneck impacts operating speed. While data transfer time often improves with subsequent generations of non-volatile memory, the interface continues to work at legacy speeds—especially with respect to the command/address path. Due to the emerging need for very high speed data transfers, the gap between command/address and data cycle times continues to increase. In the applications where a only a few bytes of data need to be accessed in the storage medium, command/address cycle time becomes a limiter for access speed.

SUMMARY

This application describes various implementations of an interface between a storage controller and a storage medium that is configured to increase the frequency of command/address cycles. Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to improve performance at the interface in a tunable and scalable manner.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 6 includes tables specifying the number of IOs that can be used by a storage medium to receive command and address data in accordance with some implementations.

Figure 1:
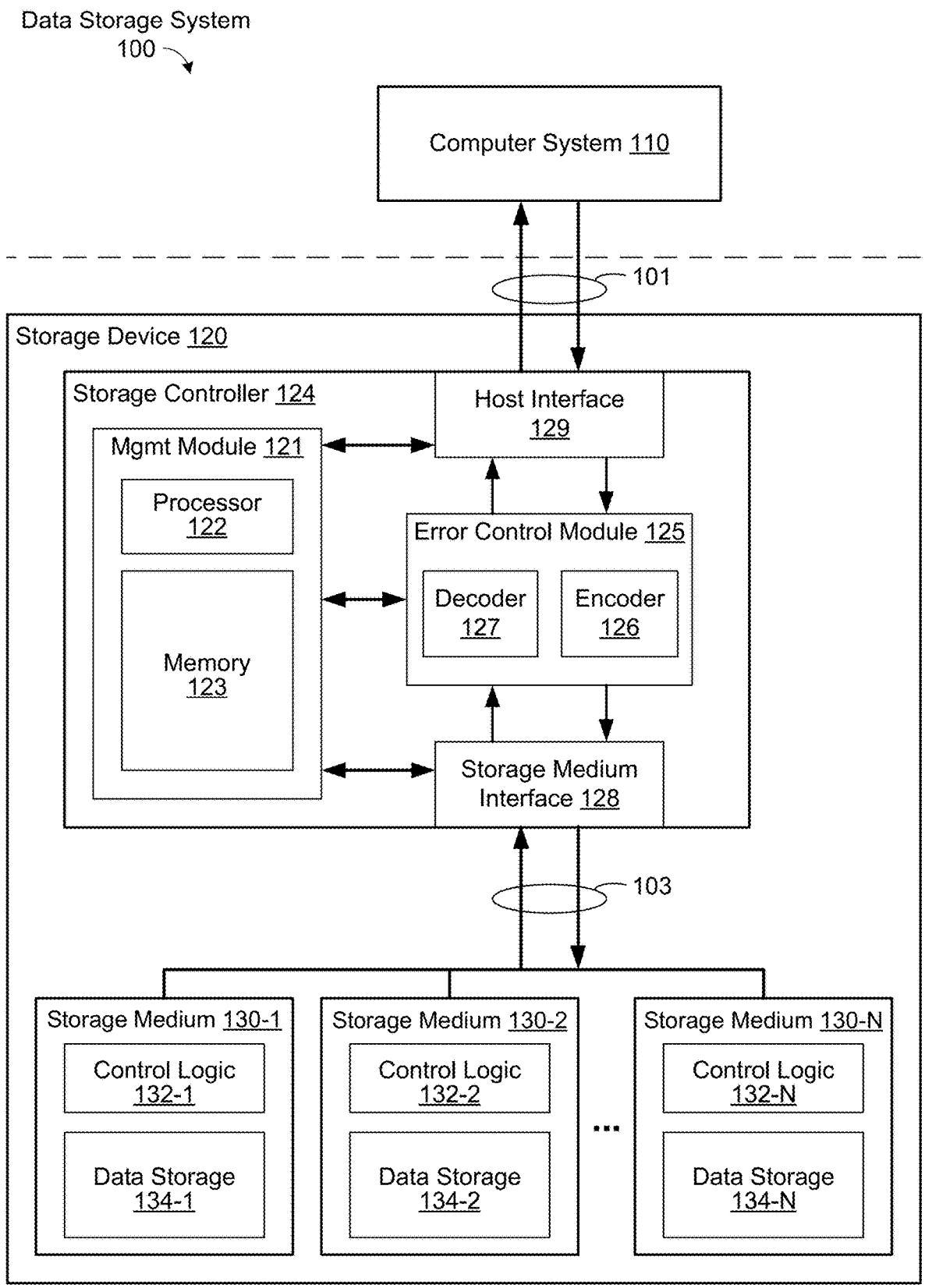
FIG. 1 is a diagram of a data storage system in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, the data storage system 100 includes a data processing system (alternatively referred to herein as a computer system or host) 110, and a storage device 120.

The computer system 110 is coupled to the storage device 120 through data connections 101. In various implementations, the computer system 110 includes the storage device 120 as a component. Generally, the computer system 110 includes any suitable computer device, such as a computer, a laptop computer, a tablet device, a netbook, an internet kiosk, a personal digital assistant, a mobile phone, a smart phone, a gaming device, a computer server, a peripheral component interconnect (PCI), a serial AT attachment (SATA), or any other computing device. In some implementations, the computer system 110 includes one or more processors, one or more types of memory, a display, and/or other user interface components such as a keyboard, a touch screen display, a mouse, a trackpad, a digital camera, and/or any number of supplemental devices to add functionality.

The storage device 120 includes one or more storage mediums 130 (e.g., N storage mediums 130, where N is an integer greater than or equal to 1). The storage medium(s) 130 are coupled to a storage controller 124 through data connections 103. In various implementations, the storage controller 124 and storage medium(s) 130 are included in the same device (e.g., storage device 120) as constituent components thereof, while in other embodiments, the storage controller 124 and storage medium(s) 130 are, or are in, separate devices. In some embodiments, the storage controller 124 is an application-specific integrated circuit (ASIC).

Each storage medium 130 includes control logic 132 and data storage 134. The data storage 134 may comprise any number (i.e., one or more) of memory devices including, without limitation, non-volatile semiconductor memory devices, such as flash memory. Flash memory devices can be configured for enterprise storage suitable for applications such as cloud computing, and/or configured for relatively smaller-scale applications such as personal flash drives or hard-disk replacements for personal, laptop and tablet computers.

In some implementations, the storage controller 124 includes a management module 121, an error control module 125, a storage medium interface 128, and a host interface 129. In some implementations, the storage controller 124 includes various additional features that have not been illustrated for the sake of brevity, and so as not to obscure more pertinent features of the example implementations disclosed herein. As such, a different arrangement of features may be possible.

The host interface 129 couples the storage device 120 and its storage controller 124 to one or more computer systems 110. The host interface 129 typically includes data buffers (not shown) to buffer data being received and transmitted by the storage device 120 via the data connections 101.

The storage medium interface 128 couples the storage controller 124 to the storage medium(s) 130. The storage medium interface 128 provides an interface to the storage medium(s) 130 though the data connections 103. In some implementations, the storage medium interface 128 includes read and write circuitry.

The error control module 125 is coupled between the storage medium interface 128 and the host interface 129. In some implementations, the error control module 125 is provided to limit the number of uncorrectable errors inadvertently introduced into data. To that end, the error control module 125 includes an encoder 126 and a decoder 127. The encoder 126 encodes data to produce a codeword which is subsequently stored in a storage medium 130. When the encoded data is read from the storage medium 130, the decoder 127 applies a decoding process to recover the data and correct errors within the error correcting capability of the error control code. Various error control codes have different error detection and correction capacities, and particular codes are selected for various applications.

The management module 121 typically includes one or more processors 122 (sometimes referred to herein as CPUs, processing units, hardware processors, processors, microprocessors or microcontrollers) for executing modules, programs and/or instructions stored in memory and thereby performing processing operations. However, in some implementations, the processor(s) 122 are shared by one or more components within, and in some cases, beyond the function of the storage controller 124. The management module 121 is coupled by communication buses to the host interface 129, the error control module 125, and the storage medium interface 128 in order to coordinate the operation of these components.

The management module 121 also includes memory 123 (sometimes referred to herein as controller memory), and one or more communication buses for interconnecting the memory 123 with the processor(s) 122. Communication buses optionally include circuitry (sometimes called a chipset) that interconnects and controls communications between system components. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the programs, modules, and/or data structures, or a subset or superset thereof, for performing one or more of the operations described in this application with regard to any of the components associated with the storage controller 124.

In some embodiments, the various operations described in this application correspond to sets of instructions for performing the corresponding functions. These sets of instructions (i.e., modules or programs) need not be implemented as separate software programs, procedures or modules, and thus various subsets of these modules may be combined or otherwise re-arranged in various embodiments. In some embodiments, the memory 123 may store a subset of modules and data structures. Furthermore, the memory 123 may store additional modules and data structures. In some embodiments, the programs, modules, and data structures stored in the memory 123, or the non-transitory computer readable storage medium of the memory 123, provide instructions for implementing any of the methods described below. Stated another way, the programs or modules stored in the memory 123, when executed by the one or more processors 122, cause the storage device 120 to perform any of the operations described below. Although FIG. 1 shows various modules, FIG. 1 is intended more as functional description of the various features which may be present in the modules than as a structural schematic of the embodiments described herein. In practice, the programs, modules, and data structures shown separately could be combined, and some programs, modules, and data structures could be separated.

Figure 2:
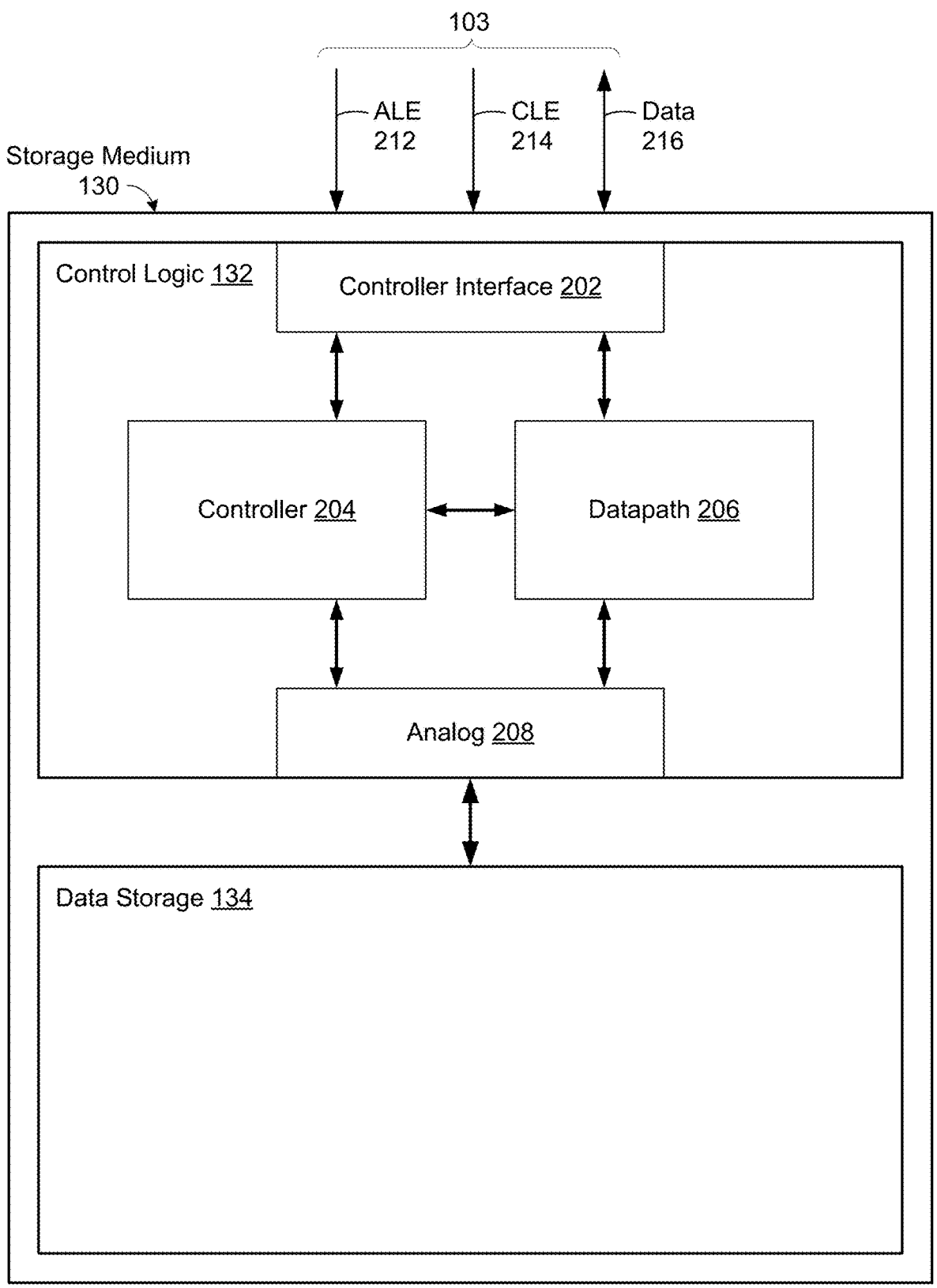
FIG. 2 is a diagram of a storage medium in accordance with some implementations.

FIG. 2 is a diagram of an implementation of a storage medium 130 as introduced above with reference to FIG. 1 (features shared with FIG. 1 are similarly numbered). While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, the storage medium 130 includes control logic 132 and data storage 134.

The control logic 132 includes a controller interface 202, a controller module 204, datapath circuitry 206, and analog circuitry 208. The controller interface 202 (also referred to as the controller interface) receives data and control signals transmitted by the storage controller 124 (FIG. 1) through the data connections 103 (e.g., as part of read, write, and erase instructions), and transmits data to the storage controller 124 (e.g., data read from the data storage 134). The controller module 204 (also referred to as the memory controller) processes control signals and data received from the storage controller 124 and executes system operations (e.g., temperature acquisition) and memory operations (e.g., read, write, erase) specified by the control signals and data. The datapath circuitry 206 (also referred to as the datapath) is a collection of functional units (e.g., arithmetic logic units, multipliers, registers, buses) that perform data processing operations as part of the implementation of the system operations and the memory operations specified for execution by the memory controller 204. The analog circuitry 208 (also referred to as the analog) is a collection of voltage and/or current circuits (e.g., charge pumps, converters) for providing particular read, write, and erase voltage levels and/or current levels necessary for performing the various memory operations specified for execution by the memory controller 204.

In some implementations, the memory controller 204 is communicatively coupled to memory (sometimes referred to herein as controller memory). The controller memory includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. In some embodiments, the controller memory comprises a non-transitory computer readable storage medium. In some embodiments, the controller memory, or the non-transitory computer readable storage medium of the controller memory, stores the programs, modules, and/or data structures, or a subset or superset thereof, for performing one or more of the operations described in this application with regard to any of the components associated with the storage medium 130.

In some embodiments, the various operations described in this application correspond to sets of instructions for performing the corresponding functions. These sets of instructions (i.e., modules or programs) need not be implemented as separate software programs, procedures or modules, and thus various subsets of these modules may be combined or otherwise re-arranged in various embodiments. In some embodiments, the controller memory may store a subset of modules and data structures. Furthermore, the controller memory may store additional modules and data structures. In some embodiments, the programs, modules, and data structures stored in the controller memory, or the non-transitory computer readable storage medium of the controller memory, provide instructions for implementing any of the methods described herein. Stated another way, the programs or modules stored in the controller memory, when executed by the one or more processors associated with the memory controller 204, cause the storage medium 130 to perform any of the operations described herein. Although FIG. 2 shows various modules, FIG. 2 is intended more as functional description of the various features which may be present in the modules than as a structural schematic of the embodiments described herein. In practice, the programs, modules, and data structures shown separately could be combined, and some programs, modules, and data structures could be separated.

The data storage 134 comprises one or more memory devices. In some implementations, the memory devices are flash memory devices, and the data storage 134 comprises at least one of NAND-type flash memory and/or NOR-type flash memory. The data storage 134 is often divided into a number of addressable and individually selectable blocks, referred to herein as selectable portions. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a plurality of pages, typically a fixed number of pages per block, and each page includes a plurality of sectors, typically a fixed number of sectors per page. For example, in some implementations, one block includes 64 pages, 128 pages, 256 pages, or another suitable number of pages. The respective sizes of blocks, pages and sectors are often a matter of design choice or end-user choice, and often differ across a wide range of enterprise and consumer devices. However, for example only, and without limitation, in some enterprise applications a page includes 2K (i.e., 2048) to 16K bytes, and a sector includes anywhere from 256 bytes to 544 bytes. Those ranges may be extended upward or downward, and/or shrink or expand depending on a particular application. In some embodiments, each page stores one or more codewords, where a codeword is the smallest unit of data that is separately encoded and decoded by the encoder and decoder mechanisms of a particular device.

In some implementations, the memory devices included in the data storage 134 are subject to various memory and/or system operations specified by the storage controller 124 and/or the memory controller 204. The controller interface 202 receives operations and data specified by the storage controller 124 through the data connections 103. In some implementations, the controller interface sequentially receives strings of data 216 having a fixed number of bits. For example, the controller interface receives 1 byte of data at a time (8 bits). Data strings comprising more than 8 bits and less than 8 bits (e.g., 1 bit) are also possible.

In some implementations, in addition to receiving the data strings 216, the controller interface 202 also receives one or more signals specifying the type of the data string. For example, the signal(s) may specify that the data string 216 represents (i) data to be written, (ii) a command specifying an operation, or (iii) an address of a selectable portion of the data stored in the data storage 134. In some implementations, the data connections 103 include other control signals, which are described in more detail below with reference to FIG. 3.

In some implementations, the controller interface 202 receives data strings 216 comprising 8 bits, 4 bits, 2 bits, or 1 bit (or more than 8 bits), and a plurality of control signals each comprising 1 or more bits. Respective signal bits correspond with respective data strings. For example, one control signal is an address latch enable (ALE) signal 212, and another control signal is a command latch enable (CLE) signal 214. The ALE signal 212, when asserted (e.g., binary "1"), specifies that the presently received data string 216 represents an address. The CLE signal 214, when asserted (e.g., binary "1"), specifies that the presently received data string 216 represents a command. When both ALE 212 and CLE 214 are not asserted (e.g., both binary "0"), this specifies that the presently received data string 216 represents data (e.g., data to be written or data to be read). These signal settings are examples, and other settings may be implemented without departing from the scope of the inventive concepts described herein. In some implementations, when ALE 212 and/or CLE 214 are asserted, the controller interface 202 routes the data string 216 to the memory controller 204 for further processing (sometimes referred to as "command phase" processing). In some implementations, when both ALE 212 and CLE 214 are not asserted, the controller interface 202 routes the data string 216 to the datapath 206 for further processing (sometimes referred to as "data phase" processing).

Figure 3:
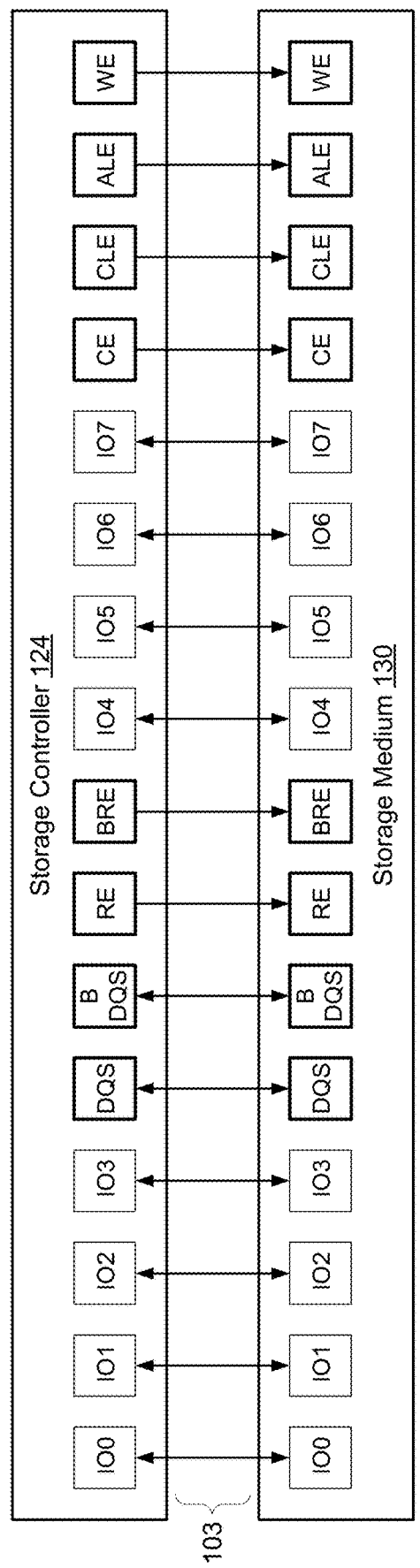
FIG. 3 is a diagram of data connections of an interface between a storage controller and a storage medium in accordance with some implementations.

FIG. 3 is a detailed diagram of data connections 103 in accordance with some implementations. The data connections 103 (also referred to as data lines, data signals, data wires, lines, signals, and/or wires) connect data and control signal pads of the storage medium interface 128 of the storage controller 124 with corresponding data and control signal pads of the controller interface 202 of the storage medium 130. The data connections 103 include an 8-bit data bus (IO0 through IO7), and various control signal connections implementing a chip enable (CE) signal, a command latch enable (CLE) signal, an address latch enable (ALE) signal, an interface clock (WE) (sometimes referred to as a write enable clock), data strobe (DQS and BDQS) signals, and read enable (RE and BRE) signals.

In some implementations, the storage controller 124 de-asserts the CE signal for a particular storage medium 130 in order to select that storage medium 130 for data transfer operations. The storage controller 124 asserts the CLE and ALE signals when transferring command and address data, respectively, to the storage medium 130, and de-asserts both CLE and ALE signals when transferring data strings to and from the storage medium 130. In some implementations, the storage controller 124 uses the WE as a clock for sending command and address data. Stated another way, the storage controller 124 may transfer command and address data to the storage medium 130 with respect to the WE clock signal.

In some implementations, DQS and BDQS are bidirectional data strobe signals with double data rate (DDR) signaling, enabling data to be transferred between the storage controller 124 and the storage medium 130 on both rising and falling edges. The DQS/BDQS signals are driven by the storage controller 124 for write operations to the storage medium 130, and driven by the storage medium 130 during read operations. Stated another way, during write and read operations, data (to be written and read) is transferred between the storage controller 124 and the storage medium 130 with respect to the DQS/BDQS clock signals. For example, during a write operation, DQS/BDQS signals are the clock for data being written. In some implementations, the storage controller 124 may use RE and BRE as clock signals during read operations. For example, during a read operation, the storage controller 124 may pass the clock on the RE/BRE signals, while the storage medium 130 transfers requested data to the storage controller 124 with respect to DQS/BDQS.

Figure 4:
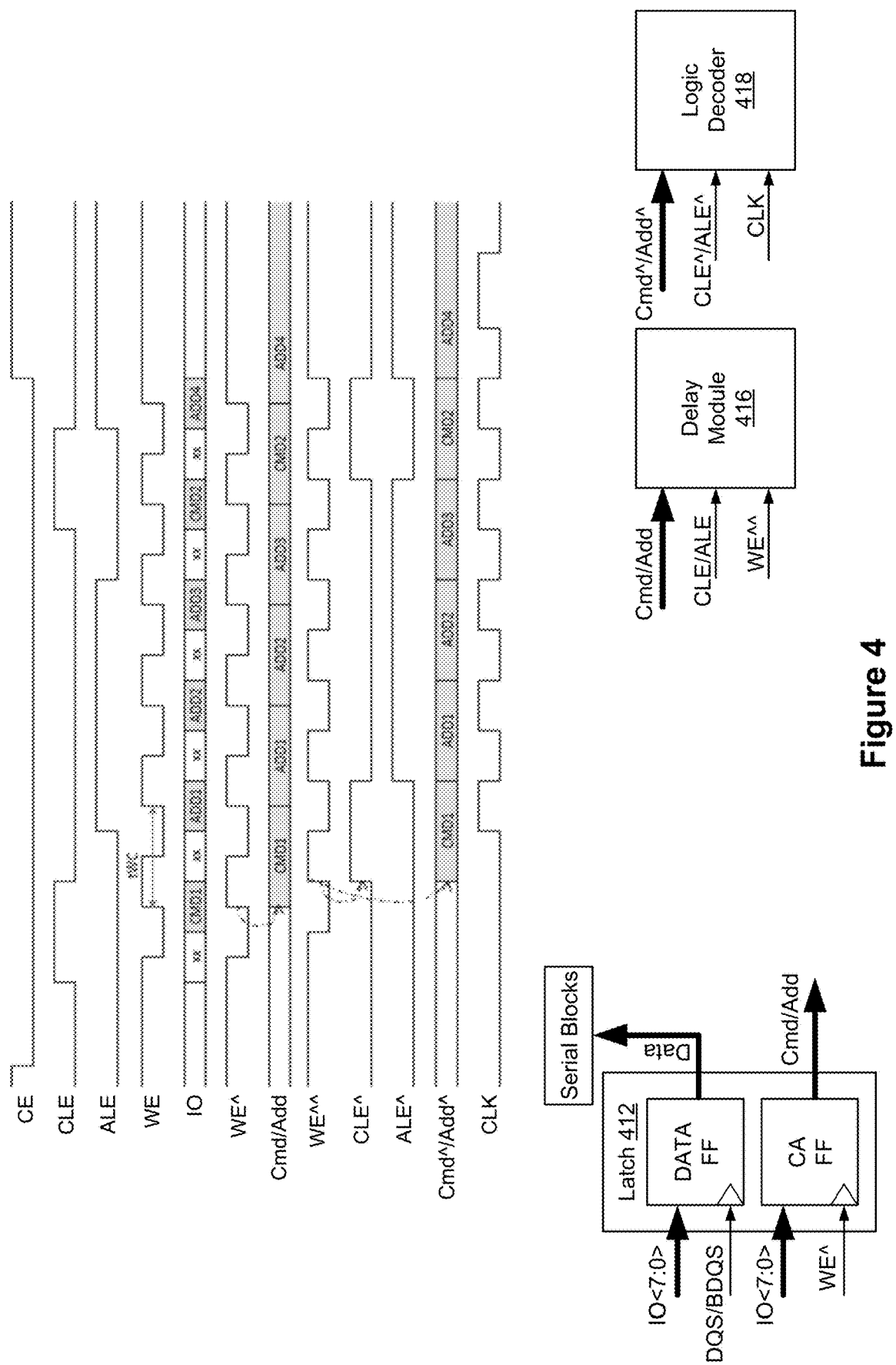
FIG. 4 is a timing diagram and corresponding datapath modules for receiving data at a storage medium in accordance with some implementations.

FIG. 4 is a timing diagram and corresponding datapath modules for receiving data at the storage medium 130 via data connections 103 at the electronic interface depicted in FIG. 3 in accordance with some implementations. The storage controller 124 de-asserts CE (logic low) to activate the storage medium 130. This enables the input receivers of CLE and ALE at the storage medium 130. The storage controller 124 asserts CLE and ALE to send command and address data, respectively. Once CLE or ALE is asserted, the input receivers of all eight data IOs (IO0 through IO7, FIG. 3) and WE at the storage medium 130 are enabled. The storage controller 124 sends command and address data using all eight IOs with respect to the WE clock. The command and address data gets latched at latching module 412 to improve the data valid window. Latching module 412 receives data at all eight IOs (IO0 through IO7). If CLE and ALE are low, the data is processed as data to be written, and is latched at a data flip flop (DATA FF) with respect to DQS/BDQS. If CLE or ALE are high, the data is processed as a command or address, respectively, and is latched at a command/address flip flop (CA FF) with respect to a clock corresponding to WE (WE^). The latch 412 passes the command or address data (Cmd/Add) to a delay module 416 of the storage controller 124, where it is re-latched along with CLE/ALE with respect to a delayed clock WE^^. The re-latched command or address data (Cmd^/Add^), along with delayed CLE^/ALE^ signals, are passed to a logic decoder 418 of the storage controller 124 with respect to a delayed clock (CLK) signal (delayed in order to meet boundary requirements). The logic decoder 418 decodes the command and address data and performs, or causes to be performed, one or more memory functions at the decoded address(es) in accordance with the decoded command(s). For example, the logic decoder 418 may switch on an appropriate control signal, which enables the storage medium 130 for the next operation commanded by the storage controller 124 on memory cells of the storage medium 130.

Figure 5:
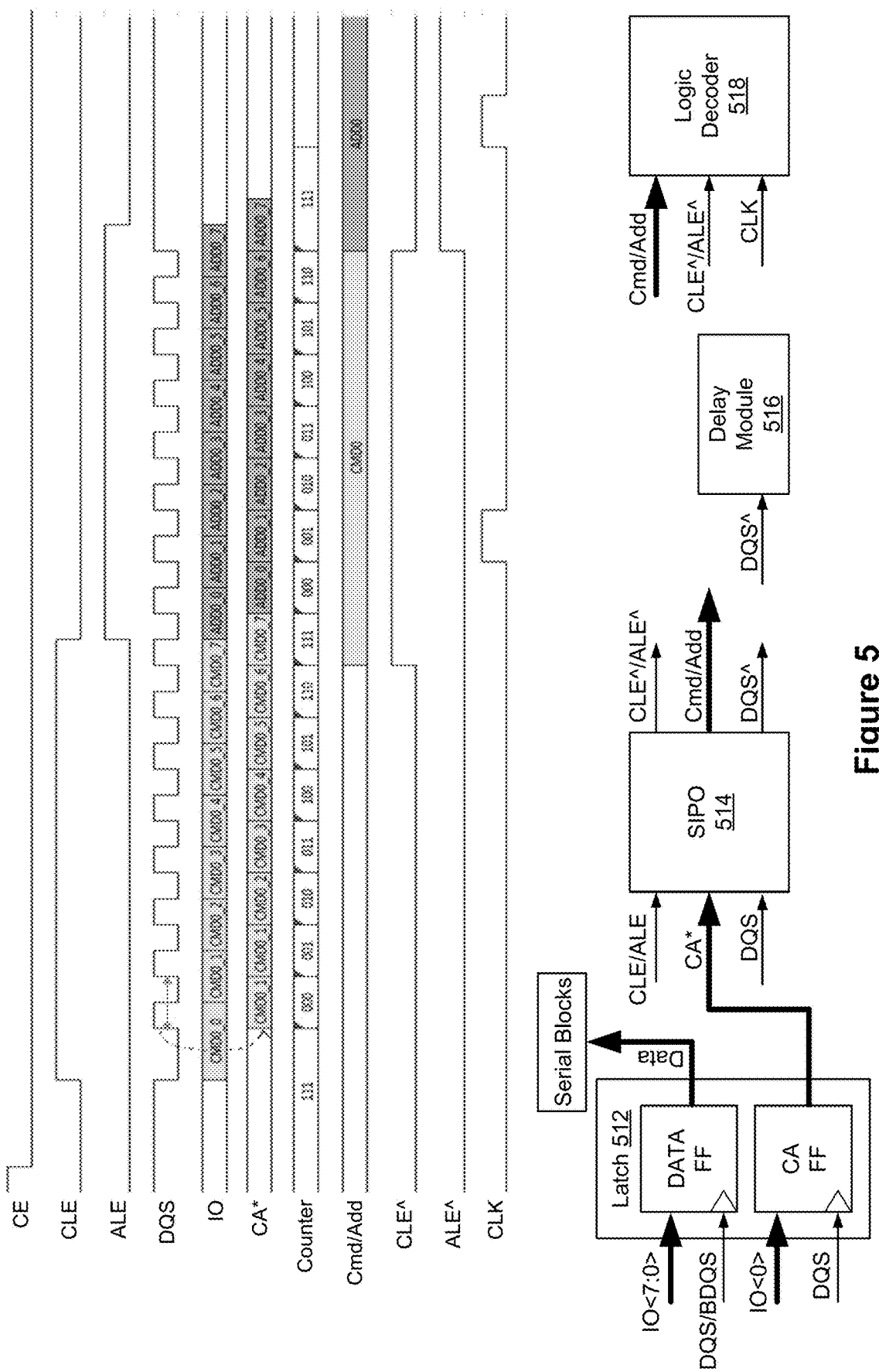
FIG. 5 is a timing diagram and corresponding datapath modules for receiving data at a storage medium in accordance with some implementations.

FIG. 5 is a timing diagram and corresponding datapath modules for receiving data at the storage medium 130 via data connections 103 at the electronic interface depicted in FIG. 3 in accordance with some implementations. The storage controller 124 de-asserts CE (logic low) to activate the storage medium 130. This enables the input receivers of CLE and ALE at the storage medium 130. The storage controller 124 asserts CLE and ALE to send command and address data, respectively. Once CLE or ALE is asserted, the input receivers of a subset of the data IOs are enabled. The subset may be only one IO (IO0, described in more detail with reference to FIG. 8), only two IOs (IO0 and IO4, described in more detail with reference to FIG. 9), only four IOs (IO0, IO2, IO4, and IO6, described in more detail with reference to FIG. 10), or eight IOs (IO0, IO1, IO2, IO3, IO4, IO5, IO6, and IO7, described in more detail with reference to FIG. 11). Each of these subsets (one, two, four, and eight) may be implemented in a programmable or tunable operating mode. When tuning the operating mode to use a subset of one, two, or four IOs to transmit and receive command and address data, each of these subsets may be referred to as a subset, less than all, of the available IOs. While FIG. 5 depicts an example subset of one IO (IO0), the concepts described with reference to this figure apply equally to the other aforementioned subsets, as described in more detail below with reference to FIGS. 6-11.

Returning to the example depicted in FIG. 5, once CLE or ALE is asserted, the input receivers of only one data IO (IO0) and DQS at the storage medium 130 are enabled. The storage controller 124 does not use WE for sending command and address data. Instead, the storage controller 124 uses DQS for sending command and address data. Stated another way, command and address data are received at the storage medium 130 with respect to DQS as the clock signal. To be clear, only one IO pad and one DQS pad are enabled at the storage medium 130.

The storage controller 124 transmits commands and addresses serially on IO0 with respect to the DQS clock signal (this may be done in DDR1 mode). For example, to transfer an 8-bit command, the storage controller 124 toggles the DQS clock 8 times, sending each of the eight bits sequentially (one bit per DQS toggle). Sending command and address bits sequentially in this manner, with respect to DQS, allows for a faster clock speed when compared to the implementation described with reference to FIG. 4.

The command and address bits first gets latched in latching module 512, which functions similarly compared to the latching module 412 described above. However, in the latching module 512, the command/address flip flop receives only one IO (IO0) and is clocked by the DQS signal. The latching module 512 improves the data valid windows of the command and address data (depicted as CA*).

The command and address data CA* is passed to a serial-in, parallel-out (SIPO) shift register of the storage medium 130. The SIPO converts the serial command and address data CA* to an 8-bit parallel command/address data stream (Cmd/Add). The SIPO also latches CLE and ALE (the latched CLE and ALE are depicted as CLE^ and ALE^), and divides the DQS clock by 8 (depicted as DQS^). A delay module 516 of the storage medium 130 adds delay to the clock signal DQS^, outputting a delayed clock signal CLK, to meet boundary requirements.

The 8-bit command/address data Cmd/Add, the latched CLE^/ALE^, and the delayed clock CLK are passed to a logic decoder 518 of the storage medium 130. The logic decoder 518 decodes the command and address data and performs, or causes to be performed, one or more memory functions at the decoded address(es) in accordance with the decoded command(s). For example, the logic decoder 518 may switch on an appropriate control signal, which enables the storage medium 130 for the next operation commanded by the storage controller 124 on memory cells of the storage medium 130.

FIG. 6 includes tables specifying the number of IOs that can be used by the storage medium 130 to receive command and address data from the storage controller 124 for different controller speed and decoder clock requirements. For example, the implementation depicted in FIG. 5 uses one IO, but other combinations of IOs can be used as well, including two, four, and eight IOs (as described in further detail below with reference to FIGS. 7-11). The number of IOs that can be used to receive command and address data (and as an extension, the number of clock cycles) may be configured on the fly, and can be based on (i) storage controller 124 operation speed requirements (TM speed), and/or (ii) logic decoder 518 clock requirements (clock time @ decoder). For example, if a particular application requires a reduced decoding time, the number of IOs used to receive command and address data may be changed (e.g., as specified in the tables). The storage controller 124 may send valid command and address bits with respect to rising edges of the clock. As decoding time continues to decrease (e.g., 0.5 ns, 0.1 ns, and so forth), the storage controller 124 may send valid command and address bits with respect to rising and falling edges of the clock (DDR).

Figure 7:
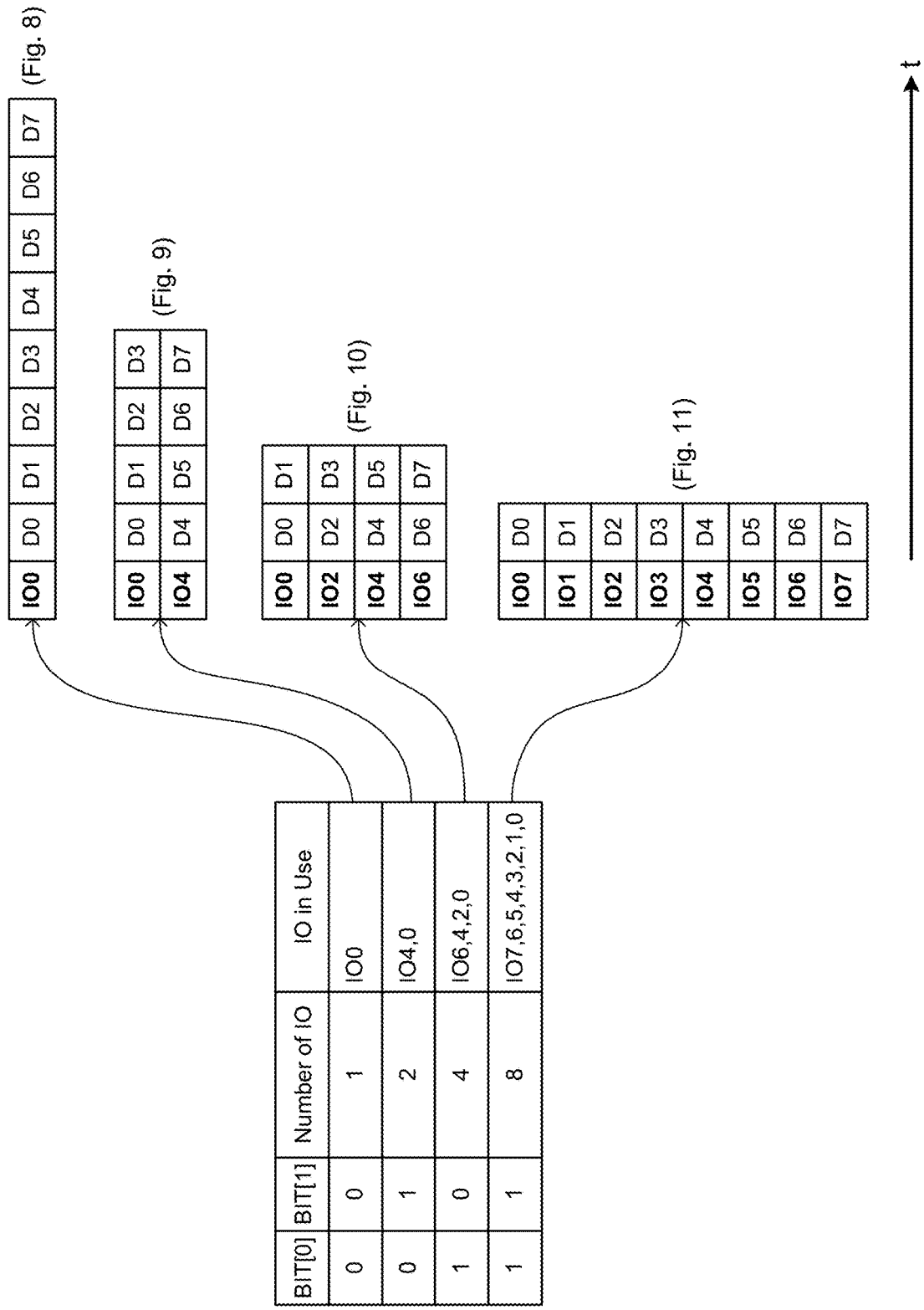
FIG. 7 depicts several configurations of IOs enabled at a storage medium for receiving command and address data in accordance with some implementations.

FIG. 7 describes four configurations of IOs enabled at the storage medium 130 for receiving command and address data from the storage controller 124 in accordance with some implementations. The SIPO 514 (FIG. 5) may be configured to process incoming command and address bits using the IOs specified by a particular mode (e.g., one IO, two IOs, four IOs, or eight IOs). The storage controller 124 may communicate this mode using two bits, depicted in FIG. 7 as BIT[0] and BIT[1]. Stated another way, the storage controller 124 specifies to the storage medium 130, based on BIT[0] and BIT[1], a particular IO configuration for receiving command and address data. In some implementations, the default IO configuration is one IO. Further, after every power-on and every reset operation, the storage controller 124 may transmit the specified IO configuration (using BIT[0] and BIT[1]) in order to put the storage medium 130 in the required state (e.g., to ensure the correct configuration of IOs is enabled and the SIPO 514 is configured correctly). Based on the IO configuration, the storage medium 130 receives (with respect to time t), and the SIPO 514 processes, command and address bits as follows:

- If the IO configuration is specified as being a single 10, IO0 of the storage medium 130 sequentially receives eight bits of the 8-bit command/address (D0 through D7). In this mode, the SIPO 514 is configured as a 1:8 SIPO, as further described below with reference to FIG. 8.
- If the IO configuration is specified as being two IOs, IO0 and IO4 of the storage medium 130 each sequentially receive four bits of the 8-bit command/address (D0-D3 and D4-D7, respectively). In this mode, the SIPO 514 is configured as a 2:8 SIPO, as further described below with reference to FIG. 9.
- If the IO configuration is specified as being four IOs, IO0, IO2, IO4, and IO6 of the storage medium 130 each sequentially receive two bits of the 8-bit command/address (D0-D1, D2-D3, D4-D5, and D6-D7, respectively). In this mode, the SIPO 514 is configured as a 4:8 SIPO, as further described below with reference to FIG. 10.
- If the IO configuration is specified as being eight IOs, IO0, IO1, IO2, IO3, IO4, IO5, IO6, and IO7 of the storage medium 130 each receive one bit of the 8-bit command/address (D0, D1, D2, D3, D4, D5, D6, and D7, respectively). In this mode, the SIPO 514 is configured as a transparent (8:8) SIPO, as further described below with reference to FIG. 11.

Figure 8:
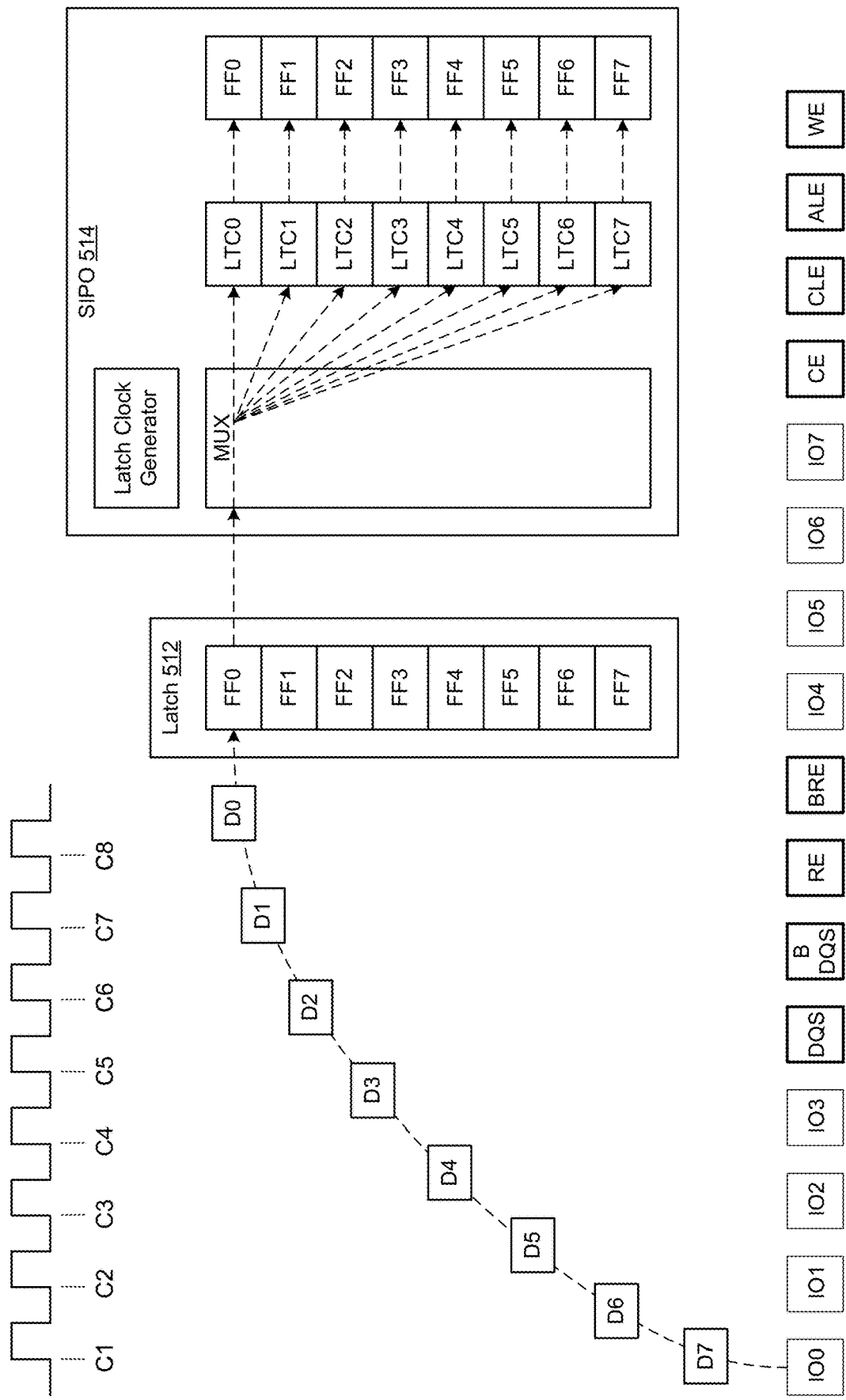
FIG. 8 is a diagram of a one-IO configuration for receiving command/address data at a storage medium in accordance with some implementations.

FIG. 8 is a diagram of a one-IO configuration for receiving command/address data at the storage medium 130 in accordance with some implementations. In this configuration, the storage controller 124 has specified (BIT[0:0]) single-IO mode to the storage medium 130. As a result, the storage medium 130 enables IO0 and sequentially receives eight bits of the 8-bit command/address (D0 through D7). A single flip flop (FF0) in the latching module 512 sequentially latches each bit and passes it to a multiplexer (MUX) in the SIPO 514 on each clocked edge (C1 through C8), which proceeds to respectively pass bits D0 through D7 to latches LTC0 through LTC7. Specifically:

At clock edge C1, FF0 passes D0 to MUX, which passes it to LTC0.
At clock edge C2, FF0 passes D1 to MUX, which passes it to LTC1.
At clock edge C3, FF0 passes D2 to MUX, which passes it to LTC2.
At clock edge C4, FF0 passes D3 to MUX, which passes it to LTC3.
At clock edge C5, FF0 passes D4 to MUX, which passes it to LTC4.
At clock edge C6, FF0 passes D5 to MUX, which passes it to LTC5.

At clock edge C7, FF0 passes D6 to MUX, which passes it to LTC6.

At clock edge C8, FF0 passes D7 to MUX, which passes it to LTC7.

When all eight bits D0 through D7 of the command/address are stored in latches LTC0 through LTC7, the SIPO 514 passes each of them through SIPO flip flops FF0 through FF8 to the logic decoder 518 (FIG. 5), at the next falling edge after C8.

Figure 9:
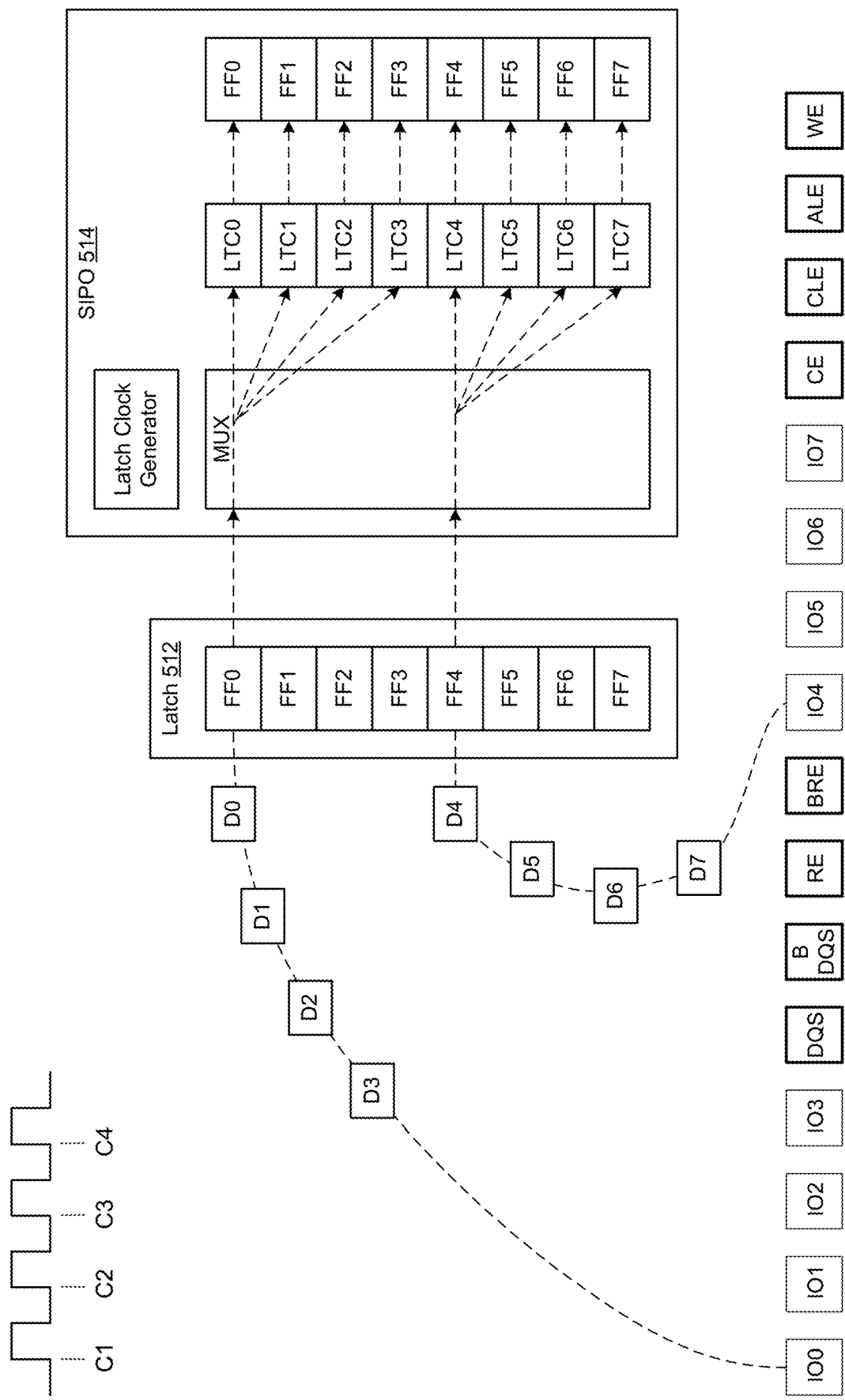
FIG. 9 is a diagram of a two-IO configuration for receiving command/address data at a storage medium in accordance with some implementations.

FIG. 9 is a diagram of a two-IO configuration for receiving command/address data at the storage medium 130 in accordance with some implementations. In this configuration, the storage controller 124 has specified (BIT[0:1]) two-IO mode to the storage medium 130. As a result, the storage medium 130 enables IO0 and IO4, each of which sequentially receives four bits of the 8-bit command/address (D0-D3 and D4-D7). Two flip flops (FF0 and FF4) in the latching module 512 sequentially latch each bit and pass it to a multiplexer (MUX) in the SIPO 514 on each clocked edge (C1 through C4), which proceeds to respectively pass bits D0-D3 to latches LTC0-LTC3 and bits D4-D7 to latches LTC4-LTC7. Specifically:

At clock edge C1, FF0 and FF4 pass D0 and D4, respectively, to MUX, which passes D0 to LTC0 and D4 to LTC4.

At clock edge C2, FF0 and FF4 pass D1 and D5, respectively, to MUX, which passes D1 to LTC1 and D5 to LTC5.

At clock edge C3, FF0 and FF4 pass D2 and D6, respectively, to MUX, which passes D2 to LTC2 and D6 to LTC6.

At clock edge C4, FF0 and FF4 pass D3 and D7, respectively, to MUX, which passes D3 to LTC3 and D7 to LTC7.

When all eight bits D0 through D7 of the command/address are stored in latches LTC0 through LTC7, the SIPO 514 passes each of them through SIPO flip flops FF0 through FF8 to the logic decoder 518 (FIG. 5), at the next falling edge after C4.

Figure 10:
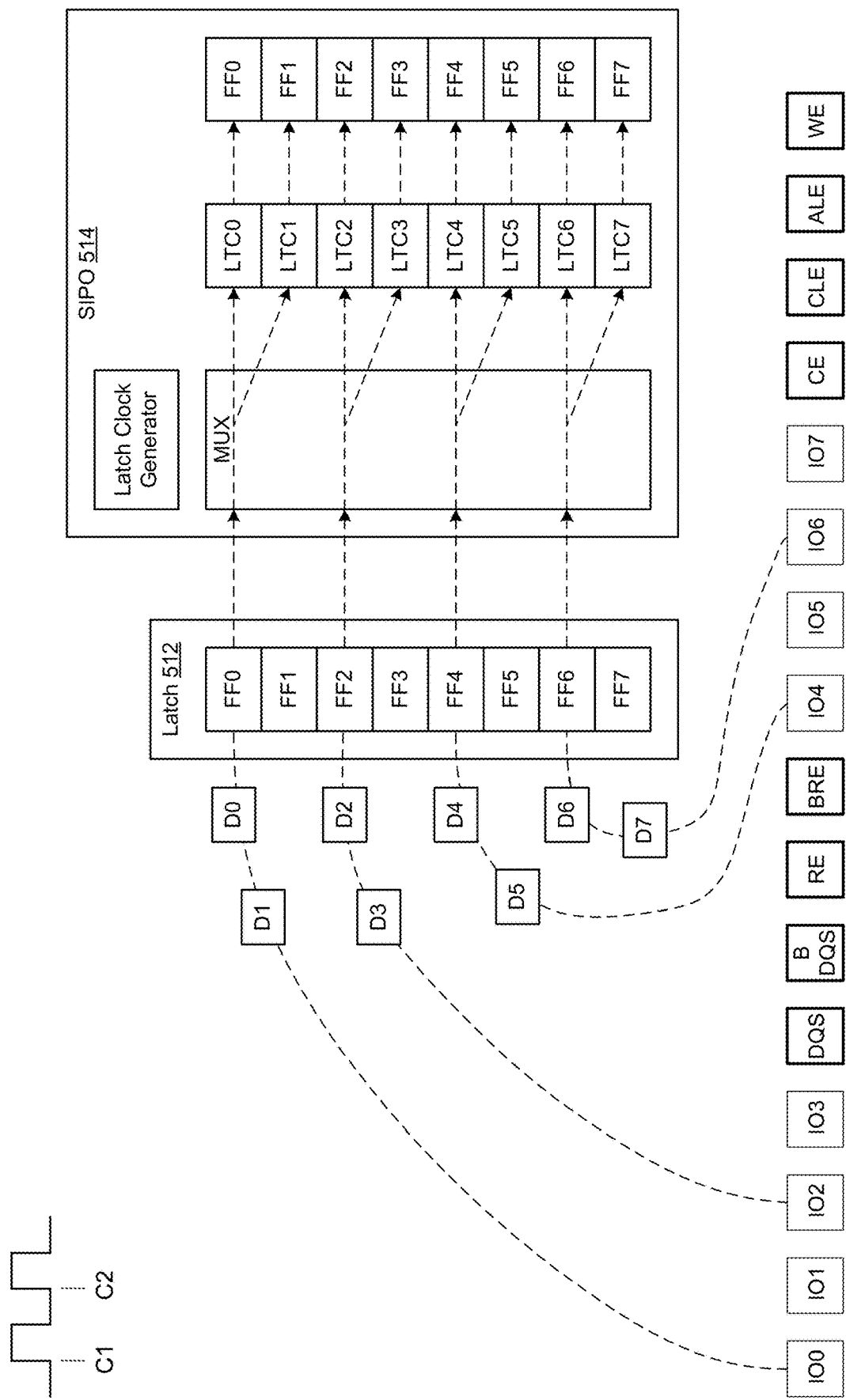
FIG. 10 is a diagram of a four-IO configuration for receiving command/address data at a storage medium in accordance with some implementations.

FIG. 10 is a diagram of a four-IO configuration for receiving command/address data at the storage medium 130 in accordance with some implementations. In this configuration, the storage controller 124 has specified (BIT[1:0]) four-IO mode to the storage medium 130. As a result, the storage medium 130 enables IO0, IO2, IO4, and IO6, each of which sequentially receives two bits of the 8-bit command/address (D0-D1, D2-D3, D4-D5, and D6-D7). Four flip flops (FF0, FF2, FF4, and FF6) in the latching module 512 sequentially latch each bit and pass it to a multiplexer (MUX) in the SIPO 514 on each clocked edge (C1 and C2), which proceeds to respectively pass bits D0-D1 to latches LTC0-LTC1, bits D2-D3 to latches LTC2-LTC3, bits D4-D5 to latches LTC4-LTC5, and bits D6-D7 to latches LTC6-LTC7. Specifically:

At clock edge C1, FF0, FF2, FF4, and FF6 pass D0, D2, D4, and D6, respectively, to MUX, which passes D0 to LTC0, D2 to LTC2, D4 to LTC4, and D6 to LTC6.

At clock edge C2, FF0, FF2, FF4, and FF6 pass D1, D3, D5, and D7, respectively, to MUX, which passes D1 to LTC1, D3 to LTC3, D5 to LTC5, and D7 to LTC7.

When all eight bits D0 through D7 of the command/address are stored in latches LTC0 through LTC7, the SIPO 514 passes each of them through SIPO flip flops FF0 through FF8 to the logic decoder 518 (FIG. 5), at the next falling edge after C2.

Figure 11:
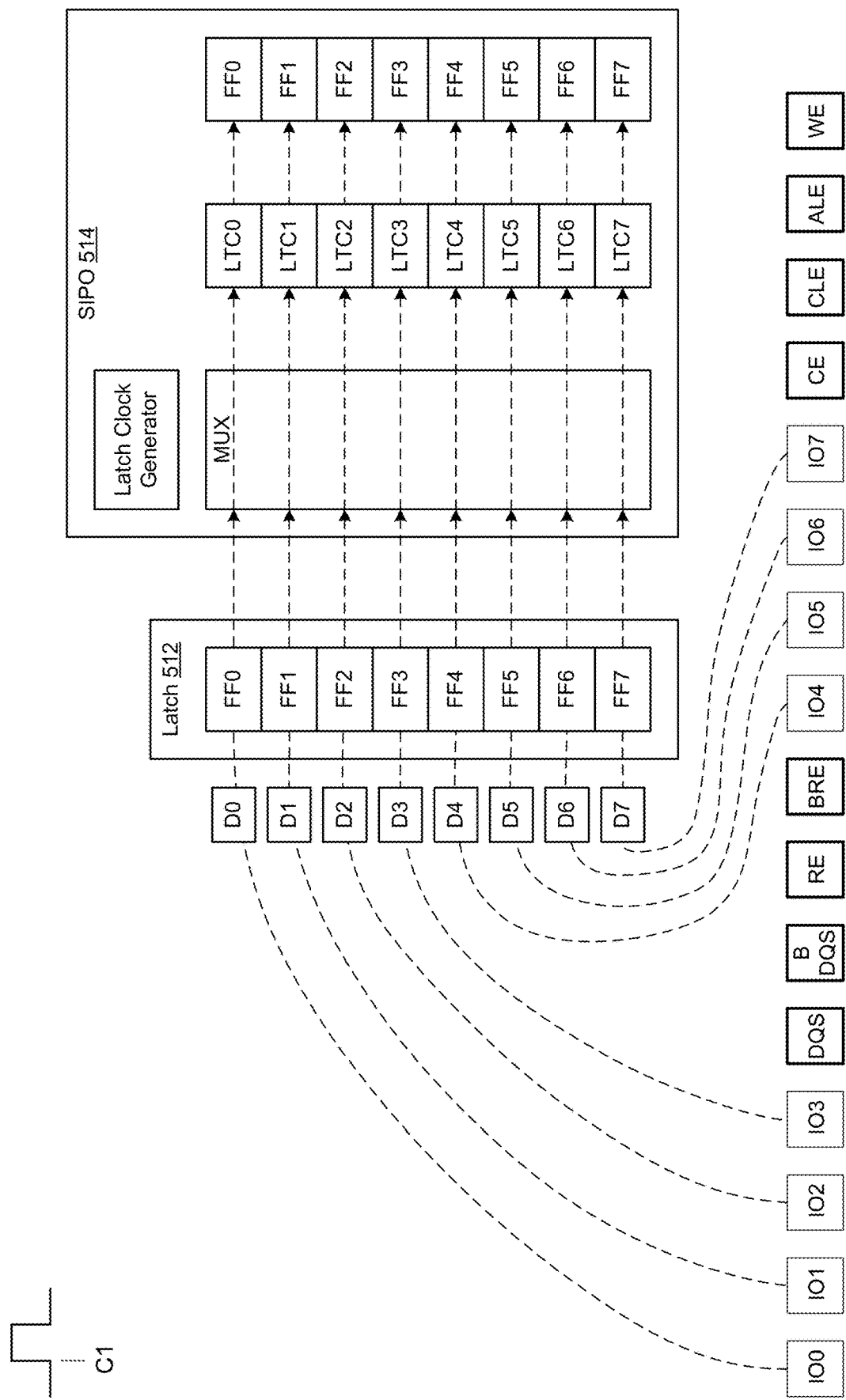
FIG. 11 is a diagram of an eight-IO configuration for receiving command/address data at a storage medium in accordance with some implementations.

FIG. 11 is a diagram of an eight-IO configuration for receiving command/address data at the storage medium 130 in accordance with some implementations. In this configuration, the storage controller 124 has specified (BIT[1:1]) eight-IO mode to the storage medium 130. As a result, the storage medium 130 enables IO0 through IO7, each of which receives one bit of the 8-bit command/address (D0-D7). Eight flip flops (FF0-FF7) in the latching module 512 latch each bit and pass it to a multiplexer (MUX) in the SIPO 514 on clock edge C1, which proceeds to respectively pass bits D0-D7 to latches LTC0-LTC7. Specifically:

At clock edge C1, FF0, FF1, FF2, FF3, FF4, FF5, FF6, and FF7 pass D0, D1, D2, D3, D4, D5, D6, and D7, respectively, to MUX, which passes D0 to LTC0, D1 to LTC1, D3 to LTC3, D4 to LTC4, D5 to LTC5, D6 to LTC6, D7 to LTC7, and D8 to LTC8.

When all eight bits D0 through D7 of the command/address are stored in latches LTC0 through LTC7, the SIPO 514 passes each of them through SIPO flip flops FF0 through FF8 to the logic decoder 518 (FIG. 5), at the next falling edge after C1.

Figure 12A:
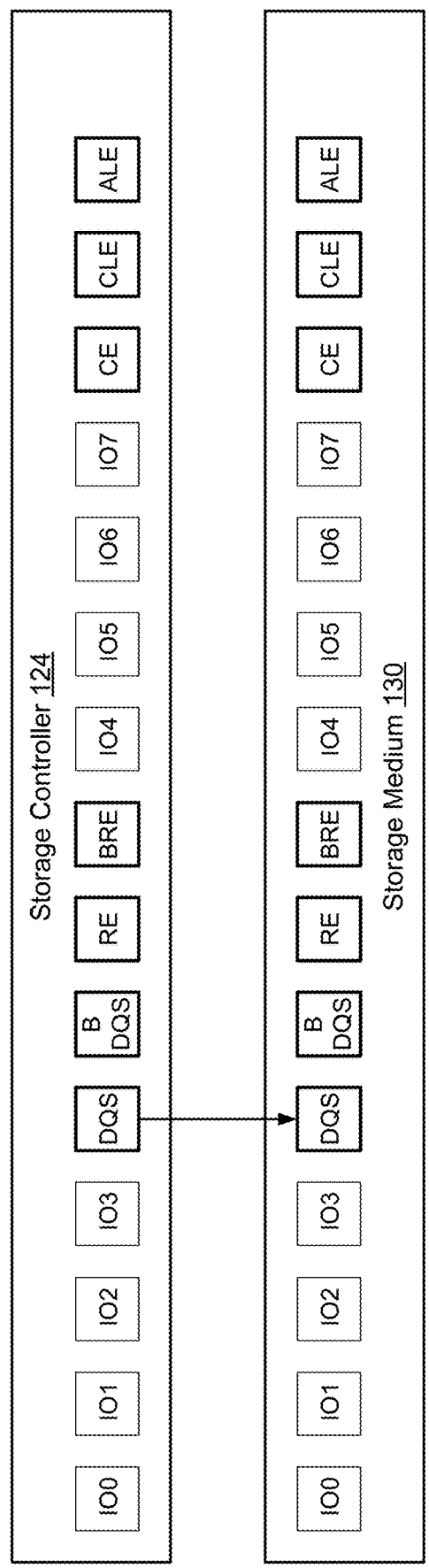
FIGS. 12A-12C are diagrams depicting alternative configurations of an interface between a storage controller and a storage medium in accordance with some implementations.
Figure 12B:
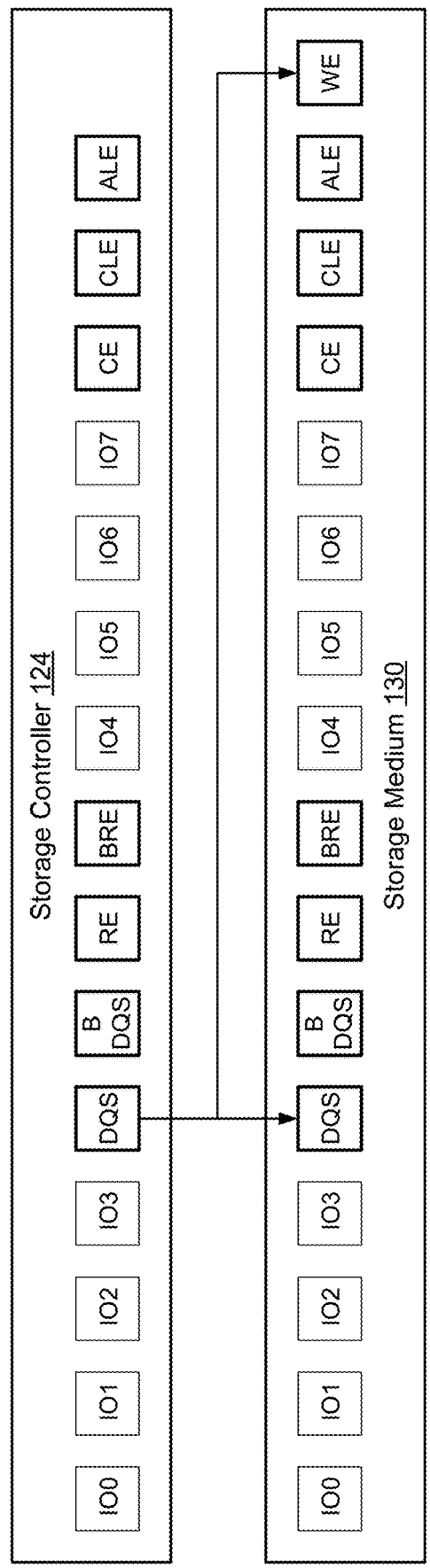
Figure 12C:
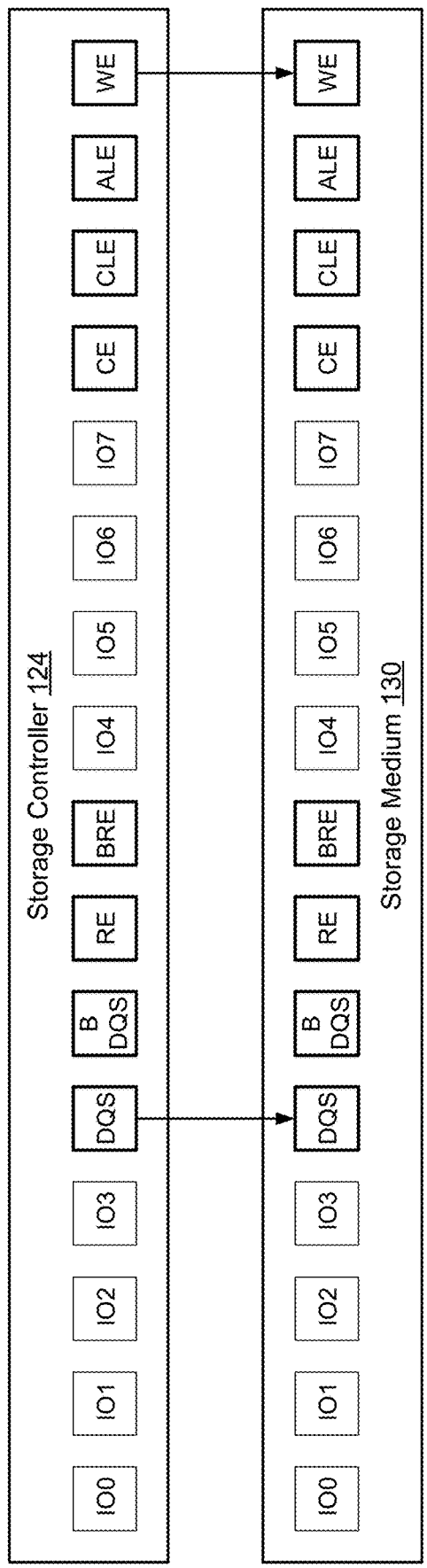

FIGS. 12A-12C are diagrams depicting three alternative configurations of the electrical interface between the storage controller 124 and the storage medium 130.

FIG. 12A depicts an electrical interface in which both the storage controller 124 and the storage medium 130 are configured to use DQS to latch command and address bits (as described above with reference to FIGS. 5-11). Since DQS is used as a clock for latching command and address bits, the WE pads on both the storage controller 124 and the storage medium 130 are no longer necessary. As such, the electrical interface may not include a WE signal (also referred to as a separate interface clock signal) and corresponding pads (as depicted in the figure). Alternatively, if the electrical interface does include WE pads, the storage controller 124 and the storage medium 130 may forgo use of WE clock signals while command and address bits are being transmitted (e.g., while either the CLE or ALE signal is asserted), or use the pads for other features by asserting signals using those pads independently of command and address transmissions (e.g., independently of the CLE and ALE signals).

FIG. 12B depicts an electrical interface in which the storage controller 124 is configured to use DQS to latch command and address bits, but the storage medium 130 is configured to retain WE as the clock for command and address data. As such, the DQS and WE pads on the storage medium 130 may be shorted, resulting in each pad receiving the DQS signal from the storage controller 124.

FIG. 12C depicts an electrical interface in which the storage controller 124 is configured to use WE to latch command and address bits, while the storage medium 130 is configured to use either DQS or WE to latch command and address bits. As such, the DQS pads for the storage controller 124 and the storage medium 130 may be connected, and the WE pads for the storage controller 124 and the storage medium 130 may be connected.

The implementations described above with reference to FIGS. 5-11 minimize clock delays when compared to the implementation described with reference to FIG. 4. For example, by using DQS as a clock while receiving command and address data, both rising and falling edges may be used. Data may be aligned with respect to the rising edge, and captured with respect to the falling edge. This provides half-cycle time to the logic decoder. Further, by closing the timing with respect to the falling edge, this eliminates the requirement of a delay element (delay module 416) while ensuring decoder boundaries conditions are met. Lastly, with new designs using ever faster decoding speeds, such designs may be implemented without having to rely on reconfiguring variable delays inherent in the use of WE as the clock (as opposed to DQS). In addition, the implementations described above with reference to FIGS. 5-11 require the use of only one oscillator at the storage controller 124 (compared to the two oscillators required for the implementation described with reference to FIG. 4). The use of one oscillator makes the interface architecture more scalable, as such an architecture may support different command and address latching speeds (e.g., from 10 ns down to 1 ns, even less).

The implementations described above with reference to FIGS. 5-11 are advantageous in that the tunability and scalability of the interface clocking speed for command and address protocol improves overall data access speed. The tunable command and address implementations described herein give flexibility to end-users to work at the required speed for a given application while reducing overhead. Lastly, since the architecture is scalable, its initial implementation may require a one-time effort, and as storage technology improves and logic decoder can work at faster speeds, the command and address datapath can be tuned as well in order to work at faster rates without requiring major redesigns.

The foregoing description has been described with reference to specific implementations. However, the illustrative discussions above are not intended to be exhaustive or to limit the claims to the precise forms disclosed. Many variations are possible in view of the above teachings. The implementations were chosen and described to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

As used herein: the singular forms "a", "an," and "the" include the plural forms as well, unless the context clearly indicates otherwise; the term "and/or" encompasses all possible combinations of one or more of the associated listed items; the terms "first," "second," etc. are only used to distinguish one element from another and do not limit the elements themselves; the term "if" may be construed to mean "when," "upon," "in response to," or "in accordance with," depending on the context; and the terms "include," "including," "comprise," and "comprising" specify particular features or operations but do not preclude additional features or operations.

What is claimed is:

1. A data storage system, comprising:
    a storage medium including a plurality of memory cells;
    a storage controller in communication with the storage medium; and
    an electrical interface between the storage medium and the storage controller, the electrical interface including:
        an N-bit data bus, where N is greater than or equal to two;
        a connection configured to carry a data strobe;
        a connection configured to carry a command latch enable signal; and
        a connection configured to carry an address latch enable signal;
    wherein, while the command latch enable signal or the address latch enable signal is asserted, the storage medium is configured to:
        (i) receive command or address data via a subset of lines of the data bus; and
        (ii) latch the command or address data using the data strobe.

2. The data storage system of claim 1, wherein:
    while the command latch enable or the address latch enable signal is asserted, the storage medium is configured to receive command or address data based on one of a plurality of programmable operating modes;
    a first of the plurality of programmable operating modes comprises receiving command or address data using only one line of the N-bit data bus, one bit at a time; and
    a second of the plurality of programmable operating modes comprises receiving command or address data using:
        N/4 lines of the N-bit data bus, one bit at a time at each of the N/4 lines;
        N/2 lines of the N-bit data bus, one bit at a time at each of the N/2 lines; or
        N lines of the N-bit data bus, one bit at a time at each of the N lines.

3. The data storage system of claim 2, wherein the storage medium further comprises:
    a shift register configured to convert the command or address data to a parallel data stream; and
    a logic decoder configured to decode the parallel data stream for further processing with respect to one or more memory cells of the storage medium.

4. The data storage system of claim 3, wherein circuitry of the storage medium is configured to pass the parallel data stream from the shift register to the logic decoder without subjecting the parallel data stream to any latching delay.

5. The data storage system of claim 1, wherein a number of lines of the N-bit data bus included in the subset is programmable at the storage controller.

6. The data storage system of claim 1, wherein a frequency of the data strobe is programmable at the storage controller.

7. The data storage system of claim 1, wherein the storage medium is further configured to latch data received while the command latch enable and the address latch enable signals are not asserted using the data strobe.

8. The data storage system of claim 1, wherein:
    the electrical interface does not include a connection configured to carry a separate interface clock signal; or
    the electrical interface includes a connection configured to carry a separate interface clock signal and the storage medium is configured to:
        forgo asserting the separate interface clock signal while either the command latch enable or the address latch enable signal is asserted, or
        assert the separate interface clock signal independently of the command latch enable and address latch enable signals.

9. A method of performing operations at an electrical interface between a storage medium including a plurality of memory cells and a storage controller in communication with the storage medium,
    the electrical interface including:
        an N-bit data bus, wherein N is greater than or equal to two;
        a connection configured to carry a data strobe;
        a connection configured to carry a command latch enable signal; and
        a connection configured to carry an address latch enable signal;

the method comprising, while the command latch enable signal or the address latch enable signal is asserted:
receiving command or address data via a subset of lines of the N-bit data bus of the electrical interface; and
latching the command or address data using the data strobe of the electrical interface.

10. The method of claim 9, further comprising:
while the command latch enable or the address latch enable signal is asserted, receiving command or address data based on one of a plurality of programmable operating modes;
wherein a first of the plurality of programmable operating modes comprises receiving command or address data using only one line of the N-bit data bus, one bit at a time; and
wherein a second of the plurality of programmable operating modes comprises receiving command or address data using:
N/4 lines of the N-bit data bus, one bit at a time at each of the N/4 lines;
N/2 lines of the N-bit data bus, one bit at a time at each of the N/2 lines; or
N lines of the N-bit data bus, one bit at a time at each of the N lines.

11. The method of claim 10, further comprises:
converting the command or address data to a parallel data stream using a shift register; and
decoding the parallel data stream for further processing with respect to one or more memory cells of the storage medium using a logic decoder.

12. The method of claim 11, further comprising passing the parallel data stream from the shift register to the logic decoder without subjecting the parallel data stream to any latching delay.

13. The method of claim 9, further comprising programming, at the storage controller, a number of lines of the N-bit data bus included in the subset.

14. The method of claim 9, further comprising programming, at the storage controller, a frequency of the data strobe.

15. A data storage system, comprising:
a storage medium including a plurality of memory cells;
a storage controller in communication with the storage medium; and
an electrical interface between the storage medium and the storage controller, the electrical interface including:
command or address data receiving means configured to receiving command or address data via a subset of lines of an N-bit data bus of the electrical interface, where N is greater than or equal to two; and
latching means configured to latch the command or address data using a data strobe of the electrical interface while a command latch enable signal of the electrical interface or an address latch enable signal of the electrical interface is asserted.

16. The data storage system of claim 15, wherein:
the receiving means are configured to receive, while the command latch enable or the address latch enable signal is asserted, command or address data based on one of a plurality of programmable operating modes;
wherein a first of the plurality of programmable operating modes comprises receiving command or address data using only one line of the N-bit data bus, one bit at a time; and
wherein a second of the plurality of programmable operating modes comprises receiving command or address data using:
N/4 lines of the N-bit data bus, one bit at a time at each of the N/4 lines;
N/2 lines of the N-bit data bus, one bit at a time at each of the N/2 lines; or
N lines of the N-bit data bus, one bit at a time at each of the N lines.

17. The data storage system of claim 16, further comprising:
shifting means for converting the command or address data to a parallel data stream; and
decoding means for decoding the parallel data stream for further processing with respect to one or more memory cells of the storage medium.

18. The data storage system of claim 17, further comprising passing means for passing the parallel data stream from the shifting means to the decoding means without subjecting the parallel data stream to any latching delay.

19. The data storage system of claim 15, further comprising programming means for programming a number of lines of the N-bit data bus included in the subset.

20. The data storage system of claim 15, further comprising programming means for programming a frequency of the data strobe.

* * * * *